United States Patent [19]

Heisey et al.

[11] Patent Number: 4,763,408
[45] Date of Patent: Aug. 16, 1988

[54] METHOD OF MAKING A COMPLIANT RETENTION SECTION ON AN ELECTRICAL TERMINAL

[75] Inventors: Jay M. Heisey, Elizabethtown; Jon F. Kautz, Camp Hill; Charles S. Pickles, Hummelstown, all of Pa.

[73] Assignee: AMP Incorporated, Harrisburg, Pa.

[21] Appl. No.: 899,709

[22] Filed: Aug. 25, 1986

Related U.S. Application Data

[62] Division of Ser. No. 677,705, Dec. 4, 1984, abandoned.

[51] Int. Cl.⁴ .............................................. H01R 43/16
[52] U.S. Cl. ...................................................... 29/874
[58] Field of Search ...................... 339/221 M, 221 R; 29/874, 882

[56] References Cited

U.S. PATENT DOCUMENTS 4,186,982  2/1980  Cobaugh et al. .
4,206,964  6/1980  Olsson .
4,446,505  5/1984  Long et al. ............... 339/221 R X
4,513,499  4/1985  Roldan .

*Primary Examiner*—Howard N. Goldberg
*Assistant Examiner*—Carl J. Arbes
*Attorney, Agent, or Firm*—Allan B. Osborne

[57] ABSTRACT

An electrical terminal has been described and illustrated which comprises a compliant retention section that has been sheared thereby forming resilient leg members joined at their ends and having outer radiussed surfaces for springably and frictionally engaging a plated through hole in an electrical panel member when the compliant retention section is inserted into the hole and inner shear surfaces which extend between the ends and into the ends to at least the outermost points of the ends so that the inner shear surfaces frictionally engage and move along each other when the resilient leg members are flexed inwardly upon insertion of the compliant retention section in the plated through hole.

2 Claims, 4 Drawing Sheets

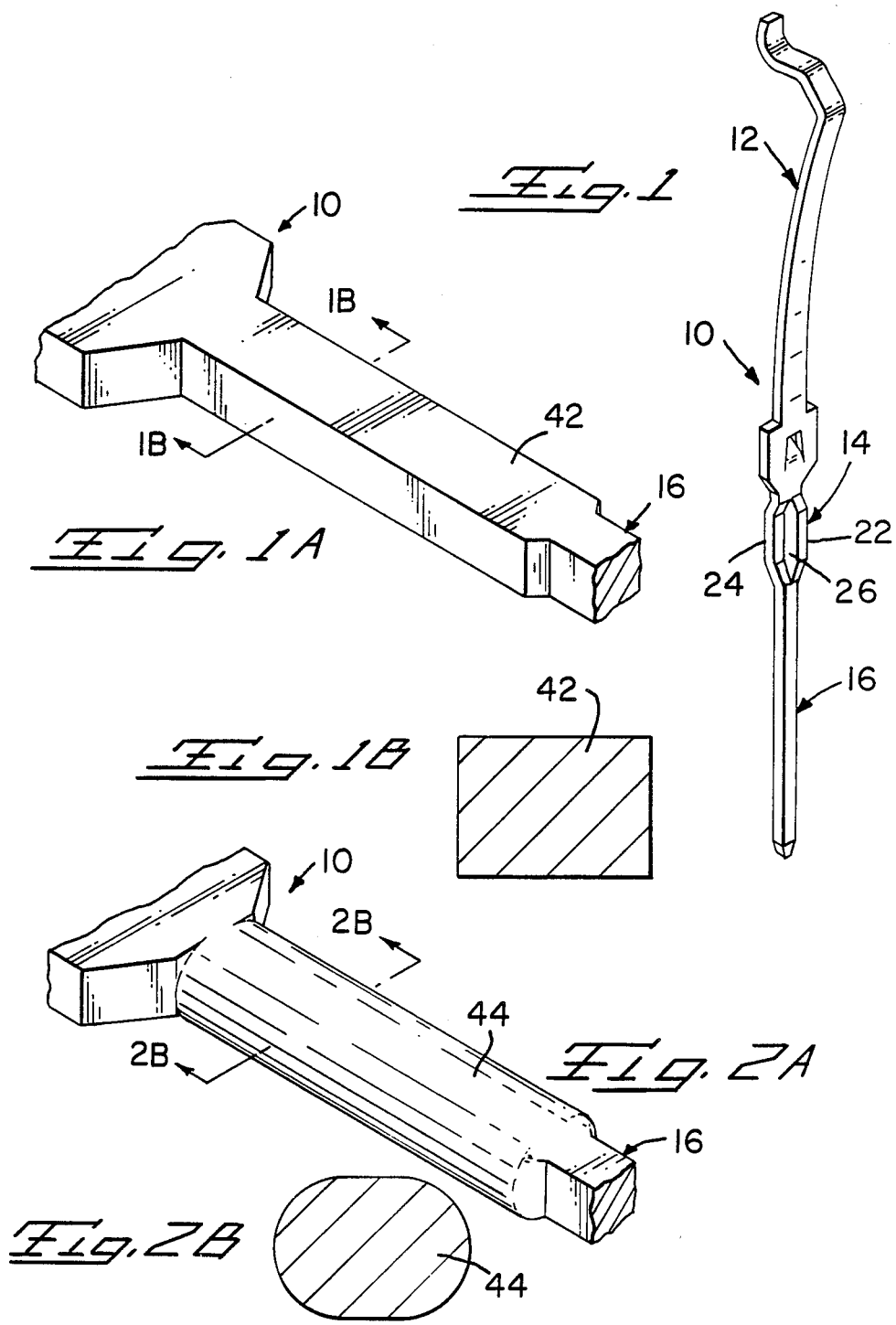

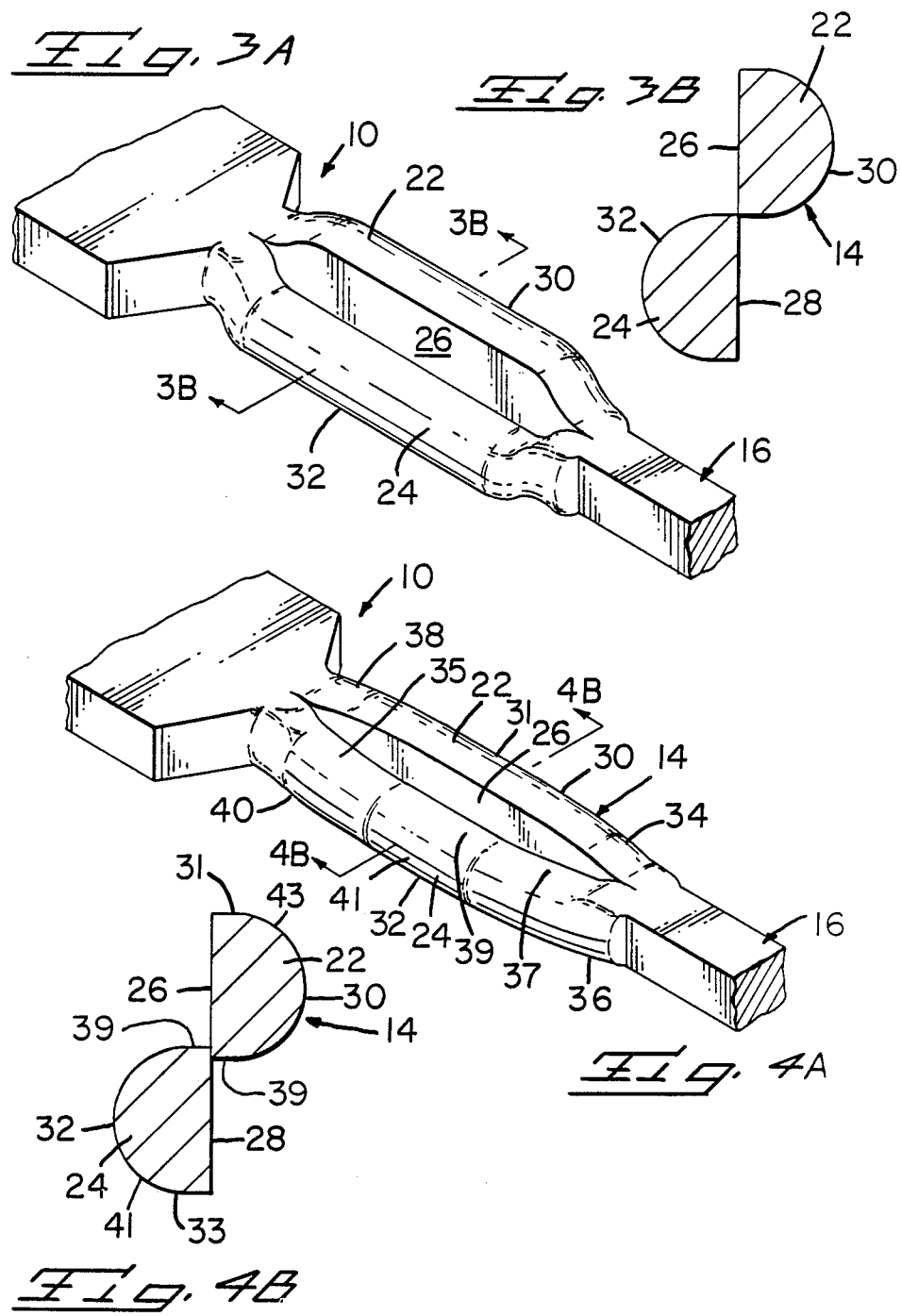

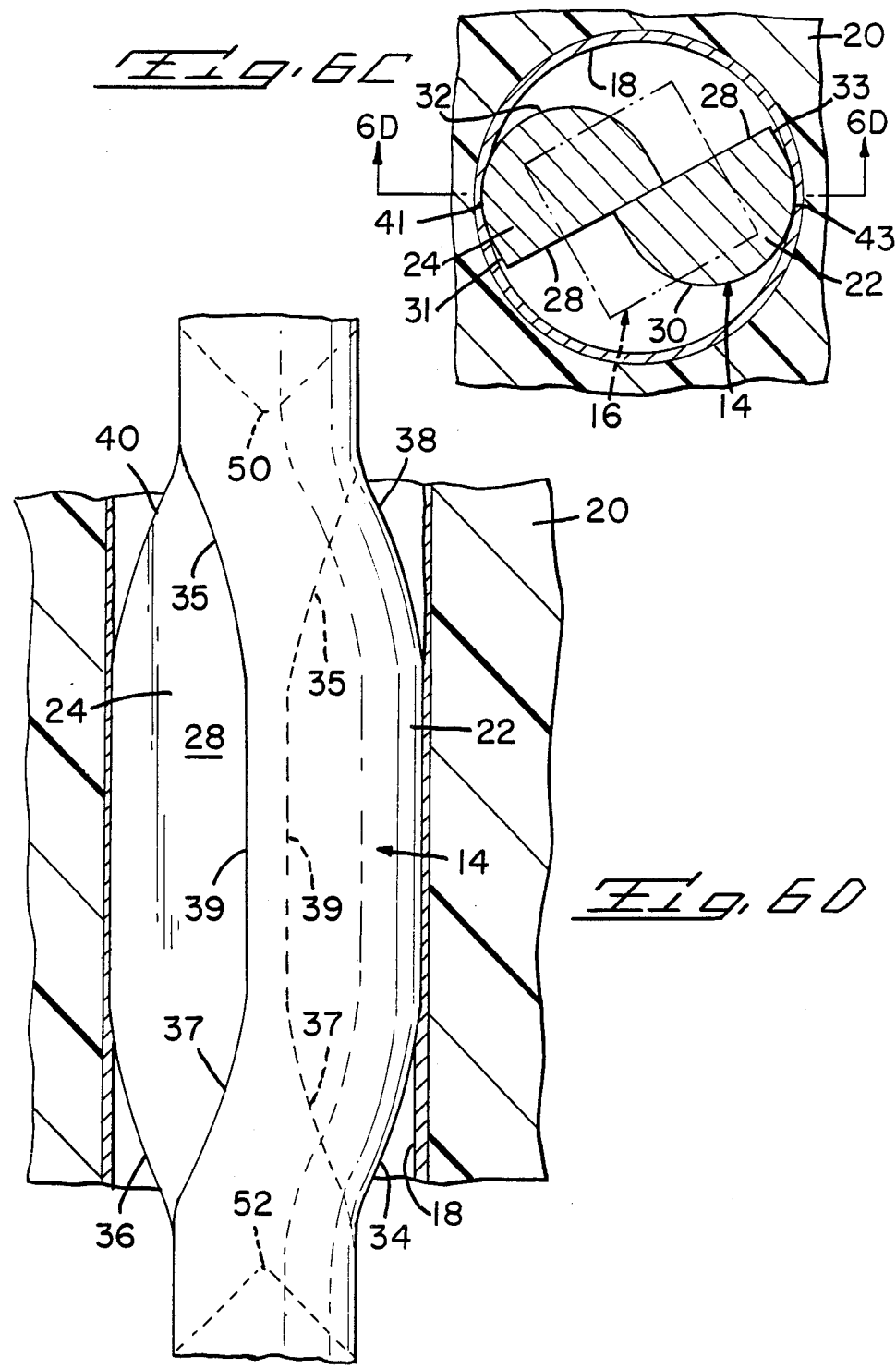

METHOD OF MAKING A COMPLIANT RETENTION SECTION ON AN ELECTRICAL TERMINAL

This is a divisional application of application Ser. No. 06/677,705, filed 12/4/84 now abandoned.

FIELD OF THE INVENTION

This invention relates to electrical terminals and more particularly to electrical terminals having a compliant retention section for mechanical engagement and electrical connection with plated through holes in a printed, etched, or multilayer circuit boards.

BACKGROUND OF THE INVENTION

Electrical terminals that have compliant retention sections for mechanical engagement and electrical connection with plated through holes in printed or etched circuit boards are known. U.S. Pat. No. 4,186,982 discloses an electrical terminal that has a section thereof which is split or sheared which forms a pair of legs that are physically offset with respect to each other along the shear plane so that inner parts of the shear surfaces overlap and engage one another thereby forming a compliant section. The ends of the legs are tapered to guide the offset legs into a plated through hole. When the legs engage the plate through hole and frictionally move therealong as the compliant section is inserted into the hole, they frictionally slide along each other as they move towards each other along the engaging shear surfaces thereby mechanically securing the compliant section in the plated through hole and electrically connected therewith.

Electrical terminals having compliant sections of this type have excellent retention characteristics thereby requiring no solder to retain them in the respective plated through holes, although solder can be used if desired.

It is essential that electrical terminals having compliant retention sections that are completely compliant over their entire length be inserted into plated through holes in printed, etched and multilayer boards with minimal distortion to the plated through holes. The compliant retention sections must also have the required retention forces to retain the electrical terminals in the plated through holes without the use of solder.

SUMMARY OF THE INVENTION

According to the present invention, a method of making a compliant retention section of an electrical terminal that is completely compliant over the entire length includes shearing a section along a shear line, displacing portions thereof on each side of the shear line in opposite directions, thereby forming resilient leg members joined at the extreme ends and having inner sheared surfaces disposed in a shear plane and then reforming the resilient leg members to form a compliant section having a length less than the length of the initially formed leg members so that the ends of the reformed resilient leg members are freely movable relative to each other.

BRIEF DESCRIPTION OF THE DRAWINGS

FIG. 1 is a perspective view of an electrical terminal having a compliant retention section.

FIG. 1A is a part perspective view of a section of the terminal in which the compliant retention section is to be formed.

FIG. 1B is a cross section taken along line 1B—1B of FIG. 1A.

FIG. 2A is a view similar to FIG. 1 showing the section as being generally oblong having rounded edges.

FIG. 2B is a cross-sectional view taken along line 2B—2B of FIG. 2A.

FIG. 3A is a perspective view like FIG. 2A showing the section formed as a first stage compliant retention section.

FIG. 3B is a cross-sectional view taken along line 3B—3B of FIG. 3A.

FIG. 4A is a perspective view like FIG. 3A showing the section formed as a completed compliant retention section.

FIG. 4B is a cross-sectional view taken along line 4B—4B of FIG. 4A.

FIG. 6C is a view identical to FIG. 6B but in larger scale and showing the compliant retention section slightly rotated in a clockwise direction in the plated through hole.

FIG. 6D is a view taken along line 6D—6D of FIG. 6C showing the compliant retention section in mechanical and electrical engagement with the plated through hole along the length of the compliant retention section.

DETAILED DESCRIPTION OF THE INVENTION

Figure 5A:
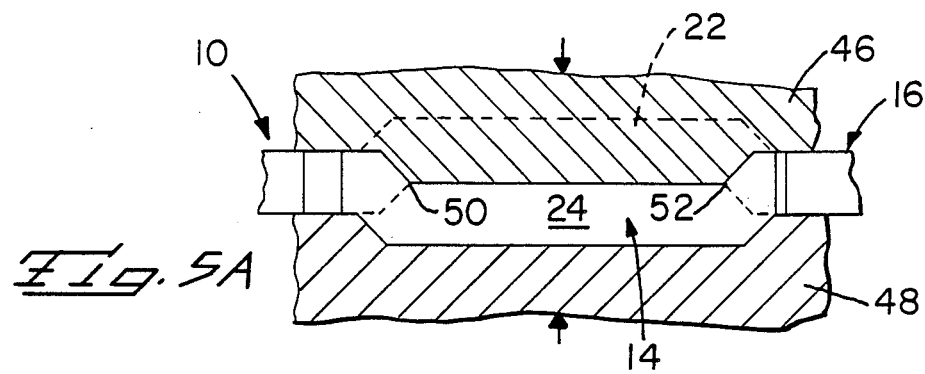
FIGS. 5A and 5B are cross-sectional views of preforming and reforming dies showing preforming of the compliant retention section of the terminal and reforming the compliant retention section to its completed form.

In reference to FIG. 1, an electrical terminal 10 is shown which comprises a cantilever contact section 12, a compliant retention section 14 and a post section 16 having a square cross section. Electrical terminals of this type can be secured in dielectric housing members in opposing rows with cantilever contact sections 12 being disposed on opposing sides of a channel so as to electrically connect with respective conductive pads on a printed circuit board matable within the channel while compliant retention sections 14 and posts 16 extend outwardly from the dielectric housing so that posts 16 extend through respective plated through holes in a printed, etched or multilayer circuit board with compliant retention sections 14 being forcefully inserted within the respective plated through holes thereby mechanically and electrically connecting the respective electrical terminals 10 with the respective plated through holes of the board.

Alternatively, electrical terminals 10 can be inserted into respective plated through holes of a printed, etched or multilayer circuit board and retained therein by compliant retention sections 14 whereafter a dielectric housing is secured onto the board over opposing rows of electrical terminals 10 which forms a channel into which an edge of a matable circuit board is disposed for electrical connection between the cantilever contact sections 12 and respective conductive pads on the circuit board. In addition, electrical terminals 10 can be in the form of feed-through terminals with contact sections 12 being in the form of post sections 16 or electrical terminals 10 can take any desired form but will include compliant retention sections 14.

Figures 6A, 6B:
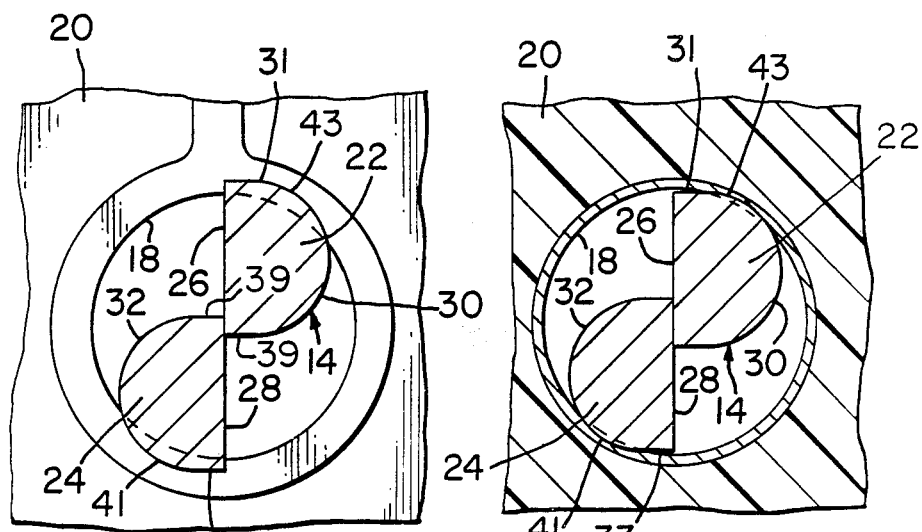
FIG. 6A is a part top plan view of a printed circuit board and a plated through hole thereof and a cross section of the compliant retention section prior to insertion thereof into the hole.
FIG. 6B is a cross-sectional view taken about midway of the printed circuit board with the compliant retention section inserted into the plated through hole.

Electrical terminals of this type are ordinarily driven into plated through holes 18 located in a panel 20, as shown in FIGS. 6A and 6B, with panel 20 taking the form of an etched, printed or multilayer circuit board. Holes 18 have a nominal diameter that is less than the maximum transverse dimension of compliant retention section 14 which, as will be explained hereinbelow, comprises a spring system which, upon insertion into the hole, produces retaining forces which act between the wall of the hole and the compliant retention section.

As shown in FIGS. 4A, 4B, 6A through 6D, compliant retention section 14 comprises a pair of resilient leg members 22, 24 which are bowed outwardly or arcuate shaped and which are offset from each other along a shear plane that includes shear surfaces 26, 28 with inner edges of shear surfaces 26, 28 extending between the ends joining the resilient leg members engaging each other in their normal positions of rest as shown in FIGS. 4B and 6A. Outer surfaces 30, 32 of resilient leg members 22, 24 are radiussed so as to be convex, as best shown in FIGS. 4B, 6A-6C. The inner parts of outer surfaces 30, 32 can have a smaller radius than outer parts thereof with the midparts and outer parts of outer surfaces 30, 32 being planar if desired. Resilient leg members 22, 24 have forward tapered surfaces 34, 36 and rear tapered surfaces 38, 40 at right angles to shear surfaces 26, 28. Forward tapered surfaces 34, 36 are tapered at an angle between 10 and 25 degrees, whereas rear tapered surfaces 38, 40 are tapered between 20 and 40 degrees. Forward tapered surfaces 34, 36 constitute lead-in surfaces for insertion of compliant retention section 14 in plated through hole 18 and the optimum angle thereof is about 15 degrees, whereas the optimum angle of rear tapered surfaces 38, 40 is about 30 degrees. The radiussed contact surfaces 41, 43 between forward tapered surfaces 34, 36 and rear tapered surfaces 38, 40 extend substantially parallel to the insertion axis of the terminal.

As shown in FIGS. 4A and 4B, compliant retention section 14 is shown in its completed form so that resilient legs 22, 24 are offset with respect to each other along shear surfaces 26, 28 which slightly engage one another at inner ends thereof so that shear surfaces 26, 28 frictionally engage and slide along each other when resilient leg members 22, 24 are flexed inwardly upon insertion of compliant retention section 14 within a plated through hole in a panel. The outer surfaces 30, 32 are convex except where tapered surfaces 34, 36, 38, 40 are located and sections 31, 33 of outer surfaces 30, 32 that extend between respective tapered surfaces 34, 38 and 36, 40 are substantially parallel, as shown in FIGS. 5B, and 6A-6C and they are at substantially a right angle with respect to shear surfaces 26, 28.

Figure 5B:
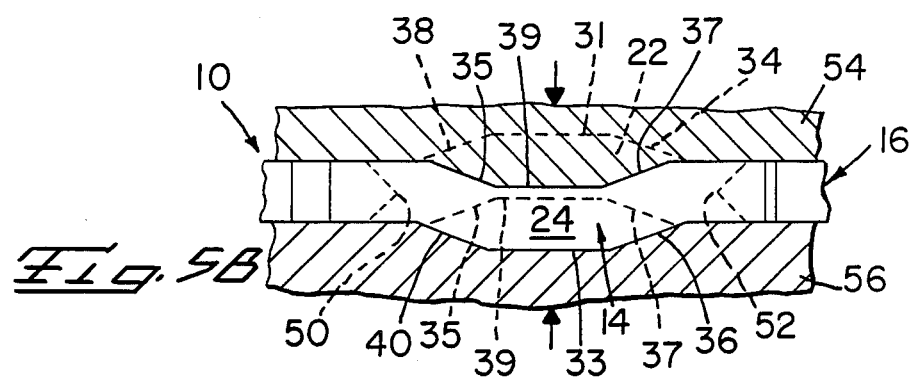

Sections 35, 37 of outer surfaces 30, 32 of each leg 22, 24 have the same angle as that of tapered surfaces 34, 36 and 38, 40, as shown in FIGS. 5B and 6D, and sections 39 are parallel to sections 31, 33. Thus, in a noninserted condition, sections 39 slightly overlap, as shown in FIGS. 4B, 5B and 6A, and leg members 22, 24 have the same thickness throughout their lengths.

Electrical terminals 10 are stamped and formed in accordance with conventional stamping and forming practices. FIGS. 1A and 1B show terminal 10 during its stamping and forming operation as having a rectangular section 42 which is the initial stage of formation of compliant retention section 14. The edges of rectangular section 42 are radiussed, as shown in FIGS. 2A and 2B, thereby forming a generally rounded oblong section 44 in the next stage of formation of compliant retention section 14. Generally rounded oblong section 44 is then subjected to a shearing operation by shearing dies 46, 48, as shown in FIG. 5A, which shear generally rounded oblong section 44 into resilient leg members 22, 24 along a shear plane extending through the insertion axis of the compliant retention section in their first stage of formation thereby preforming compliant retention section 14, as shown in FIGS. 3A, 3B and 5A. In this preforming stage, the forward and rear tapered surfaces are tapered at about a 45 degree angle and the sheared area extends between positions 50, 52 along compliant retention section 14. A space can result between the inner edges of the shear surfaces between the joined ends of the leg members 22, 24 thereby ensuring that the leg members are completely sheared over the entire lengths of their sheared surfaces.

In the final form of compliant retention section 14 as shown in FIG. 5B, reforming dies 54, 56 reform compliant retention section 14 so that resilient leg members 22, 24 have less length than legs 22, 24 in the initial forming stage as shown in FIG. 5A and tapered surfaces 34, 36, 38 and 40 are tapered to their final configuration as shown in FIGS. 4A, 5B and 6D. Compliant retention section 14 in its reformed configuration as shown in FIGS. 4A, 5B and 6D is completely sheared over its complete length because the sheared area between positions 50, 52 extends beyond the length of compliant retention section 14 thereby rendering compliant retention section 14 completely compliant over its entire length so that the ends containing the tapered surfaces 34, 36 and 38, 40 are sheared clear through and the sheared surfaces thereof engage each other and are movable relative to each other. Thus, the resilient leg members 22, 24 are completely compliant over their entire lengths because the points 50, 52 of shear, as shown in FIGS. 5B and 6D, extend to at least the outermost points of the ends of resilient leg members 22, 24. Thus, shear surfaces 26, 28 extend along leg members 22, 24 between the sheared ends and clear through the sheared ends and shear surfaces 26, 28 engage each other in the sheared ends and along the overlapping inner ends of the shear surfaces between the sheared ends.

As shown in FIGS. 5B and 6D, the engaging sheared surfaces in the sheared ends form a generally triangular area and the slightly overlapping of shear surfaces 26, 28 along sections 39 form a generally rectangular area, both of which increase when compliant retention section 14 is inserted into a plated through hole.

As shown in FIG. 6A, resilient leg members 22, 24 are disposed at their fullest offset positions so that the outermost parts 31, 33 of outer surfaces 30, 32 of leg members 22, 24 extend beyond the diameter of plated through hole 18 so that when compliant retention section 14 is inserted within plated through hole 18, tapered surfaces 34, 36 will engage hole 18 thereby causing leg members 22, 24 to begin to move toward each other along shear surfaces 26, 28, and when contact surfaces 41, 43 of the radiussed outer surfaces 30, 32 of resilient leg members 22, 24 engage plated through hole 18, they frictionally move along hole 18 and in so doing generate inwardly-directed forces onto leg members 22, 24 which are at an angle with respect to the plane containing shear surfaces 26, 28 thereby causing leg members 22, 24 to generate spring forces against the wall of hole 18. Also, as leg members 22, 24 are inserted into plated through hole 18, frictional forces are generated as shear surfaces 26, 28 frictionally move along each other until compliant retention section 14 is fully inserted in plated through hole 18, as shown in FIGS. 6B and 6D, whereby shear surfaces 26, 28 are overlapping over a greater area than they were prior to insertion of compliant section 14 within hole 18 and they frictionally engage one another and outer surfaces 30, 32 of leg members 22, 24 also frictionally engage the wall of hole 18 so that under the influence of the spring and frictional forces generated by retention section 14, the wall of hole 18 and the material characteristics of retention section 14, plated through hole 18, and panel member 20, terminal 10 is retained in hole 18. It is to be noted that the combined cross-sectional dimension of leg members 22, 24 in a direction perpendicular to the shear plane remains substantially the same as that of the combined cross-sectional dimension of the leg members prior to insertion of the compliant retention section 14 into the hole.

The tapered surfaces 34, 36 and radiussed surfaces 30, 32 of resilient leg members 22, 24 facilitate insertion of compliant retention section 14 into plated through hole 18 of panel 20, and they do not severely score or broach the plated through hole during such insertion in addition to placing undue stresses in the areas of the panel surrounding the plated through hole. Outer surfaces 30, 32 along contact surfaces 41, 43 engage the plated through hole over a large area therebetween as shown in FIG. 6D which enhances the retention of the compliant retention section in the hole and provides a substantial electrical contact area therebetween. If undue stresses were formed in these areas, the panel is susceptible to warpage thereby resulting in misalignment of the electrical terminals which would prevent the terminals from being utilized in conjunction with wire-wrapping or other terminating equipment for terminating wires to the post sections of the terminals or mating with other electrical terminals of matable electrical connectors.

The frictional movement of the contact surfaces 41, 43 of resilient leg members 22, 24 of compliant retention section 14 along the metal plating of plated through hole 18 in panel 20 causes a wiping action to take place thereby breaking down any oxide coatings on the contact surfaces and the metal plating thereby resulting in an excellent electrical connection therebetween. The retention forces of the areas of engagement between the resilient leg members and the plated through hole forms a gas-tight connection that will be protection against environmental degradation and will maintain electrical integrity for an extended period of time. Further, no solder is required to retain the compliant retention sections in the holes authough solder can be used if desired to comply with specific specifications.

Shear surfaces 26, 28 between the sheared ends can be slightly spaced from each other prior to insertion of compliant retention section 14 into a plated through hole with sections 39 slightly overlapping, but when compliant retention section 14 is inserted into the hole, shear surfaces 26, 28 engage each other and frictionally move overlappingly along each other during such insertion.

Shear surfaces 26, 28 between the sheared ends can be slightly spaced from each other and sections 39 can also be slightly spaced from each other prior to insertion of compliant retention section 14 into a plated through hole; however, when compliant retention section 14 is inserted into the hole, shear surfaces 26, 28 engage each other and frictionally move along each other in an overlapping manner.

In both previous cases, the shear surfaces of the sheared ends engage each other and are frictionally movable relative to each other upon flexing of the resilient leg members 22, 24.

The compliant retention sections 14 of electrical terminals 10 can be inserted into plated through holes in conventional printed, etched or multilayer circuit boards that vary between a minimum hole size of 0.037 inches to a maximum hole size of 0.043 inches. Of course, compliant retention sections 14 can work in any size hole. The insertion force for insertion of the compliant retention section 14 into plated through hole 18 is less than prior art compliant retention sections due to the fact that the resilient leg members 22, 24 are completely movable over their entire lengths of the compliant retention section since the resilient leg members are sheared along their entire lengths and in fact beyond the compliant section. This will reduce the cost for such insertion equipment. Additionally, as a result of the substantially lower insertion forces required to insert the compliant retention sections of the electrical terminals of the present invention into plated through holes, distortion of the minimum size holes will not exceed the specified distortion limits; therefore, electrical terminals containing the compliant retention sections of the present invention can be readily used in plated through holes of multilayer circuit boards and any other substrate in which minimal hole distortion is required without any damage to the plated through holes and/or the panels thereof.

As can be discerned, an electrical terminal has been described and illustrated which comprises a compliant retention section that has been sheared thereby forming resilient leg members joined at their ends and having outer radiussed surfaces for springably and frictionally engaging a plated through hole in an electrical panel member when the compliant retention section is inserted into the hole and inner shear surfaces which extend between the ends and into the ends to at least the outermost points of the ends so that the inner shear surfaces frictionally engage and move along each other when the resilient leg members are flexed inwardly upon insertion of the compliant retention section in the plated through hole.

We claim:

1. A method of making a compliant section on an electrical terminal with said compliant section having a resilient leg member on each side of shear plane, said method comprising the steps of:

forming an elongated, generally oblong section along a length of the terminal intermediate the ends thereof;

shearing said oblong section along a shear line extending for the length of said oblong section while simultaneouly displacing sheared portions on each side of said shear line in opposite directions normal to said oblong section; and reforming the ends of said oblong section by displacement thereof to approximately their original position, thereby providing, within said oblong section, a compliant section having resilient leg members displaced outwardly in opposite directions relative to each other and with a shear plane therebetween extending beyond the ends thereof.

2. The method of claim 1 including the step of providing said resilient leg members with a lead-in angle at each end simultaneously with the step of reforming the ends of said oblong section.

* * * * *